(12) United States Patent
Kim et al.

(10) Patent No.: US 9,054,189 B1
(45) Date of Patent: Jun. 9, 2015

(54) SEMICONDUCTOR DEVICE AND METHOD FOR FABRICATING THE SAME

(71) Applicant: SAMSUNG ELECTRONICS CO., LTD., Gyeonggi-do (KR)

(72) Inventors: Jin-Bum Kim, Seoul (KR); Taek-Soo Jeon, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 14/148,110

(22) Filed: Jan. 6, 2014

(51) Int. Cl.
*H01L 29/78* (2006.01)
*H01L 29/66* (2006.01)

(52) U.S. Cl.
CPC ...... *H01L 29/7848* (2013.01); *H01L 29/66795* (2013.01); *H01L 29/7851* (2013.01)

(58) Field of Classification Search
CPC ............ H01L 29/66795; H01L 29/785; H01L 29/66772; H01L 29/78645; H01L 29/78648
See application file for complete search history.

(56) References Cited

U.S. PATENT DOCUMENTS

| 6,936,869 | B2 | 8/2005 | Webb et al. |
| 8,035,199 | B2 | 10/2011 | Izumida et al. |
| 8,263,451 | B2 | 9/2012 | Su et al. |
| 8,330,231 | B2 | 12/2012 | Zhang et al. |
| 8,362,575 | B2 | 1/2013 | Kwok et al. |
| 2010/0230721 | A1 | 9/2010 | Yasutake |
| 2011/0147828 | A1 | 6/2011 | Murthy et al. |
| 2014/0361373 | A1* | 12/2014 | Hung et al. ............ 257/365 |

FOREIGN PATENT DOCUMENTS

| KR | 1020050030996 | 4/2005 |
| KR | 1020050096381 | 10/2005 |
| KR | 1020100038631 | 4/2010 |

* cited by examiner

*Primary Examiner* — Hoai V Pham
(74) *Attorney, Agent, or Firm* — F. Chau & Associates, LLC

(57) ABSTRACT

A semiconductor device is provided. An active fin protrudes from a substrate. A gate structure is formed on the substrate and the active fin. The gate structure extends in a first direction. The gate structure crosses a first region of the active fin in a second direction. A first epitaxial layer is formed on a second region of the active fin. The second region of the active fin is not covered with the gate structure. A second epitaxial layer is formed on the first epitaxial layer, the second epitaxial layer including an impurity. The first epitaxial layer includes a blocking material. The blocking material of the first epitaxial layer prevents the impurity of the second epitaxial layer from passing through the first epitaxial layer to block diffusion of the impurity to a channel region formed in the first region of the active fin.

15 Claims, 14 Drawing Sheets

US 9,054,189 B1

SEMICONDUCTOR DEVICE AND METHOD FOR FABRICATING THE SAME

TECHNICAL FIELD

The present inventive concept relates to a semiconductor device and a method for fabricating the same.

DISCUSSION OF RELATED ART

Fin field effect transistors (FinFETs) are more tolerable to a short channel effect than planar field effect transistors. FinFETs include a channel which is formed in a three-dimensional space structure to provide a higher driving current at a low voltage. Carrier mobility in a channel region of semiconductor devices is increased when mechanical stress is applied to the channel region.

SUMMARY

According to an exemplary embodiment of the present inventive concept, a semiconductor device is provided. An active fin protrudes from a substrate. A gate structure is formed on the substrate and the active fin. The gate structure extends in a first direction. The gate structure crosses a first region of the active fin in a second direction. A first epitaxial layer is formed on a second region of the active fin. The second region of the active fin is not covered with the gate structure. A second epitaxial layer is formed on the first epitaxial layer, the second epitaxial layer including an impurity. The first epitaxial layer includes a blocking material. The blocking material of the first epitaxial layer prevents the impurity of the second epitaxial layer from passing through the first epitaxial layer to block diffusion of the impurity to a channel region formed in the first region of the active fin.

According to an exemplary embodiment of the present inventive concept, the second epitaxial layer includes a stress material which causes the second epitaxial layer to apply stress to the channel region.

According to an exemplary embodiment of the present inventive concept, a method for fabricating a semiconductor device is provided. An active fin protruding from a substrate is formed. A gate structure is formed on the substrate and the active fin. The gate structure extends in a first direction, crossing a first region of the active fin in a second direction. The active fin is partially removed to form a second region of the active fin. The second region of the active fin is not covered with the gate structure. A first epitaxial layer having a blocking material is formed on the second region of the active fin. A second epitaxial layer having an impurity is formed on the first epitaxial layer. The blocking material is doped in the forming of the first epitaxial layer, and the impurity is doped in the forming of the second epitaxial layer. The blocking material of the first epitaxial layer prevents the impurity of the second epitaxial layer from passing through the first epitaxial layer to block diffusion of the impurity of the second epitaxial layer to a channel region formed in the first region of the active fin.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EXEMPLARY EMBODIMENTS

Figure 1:
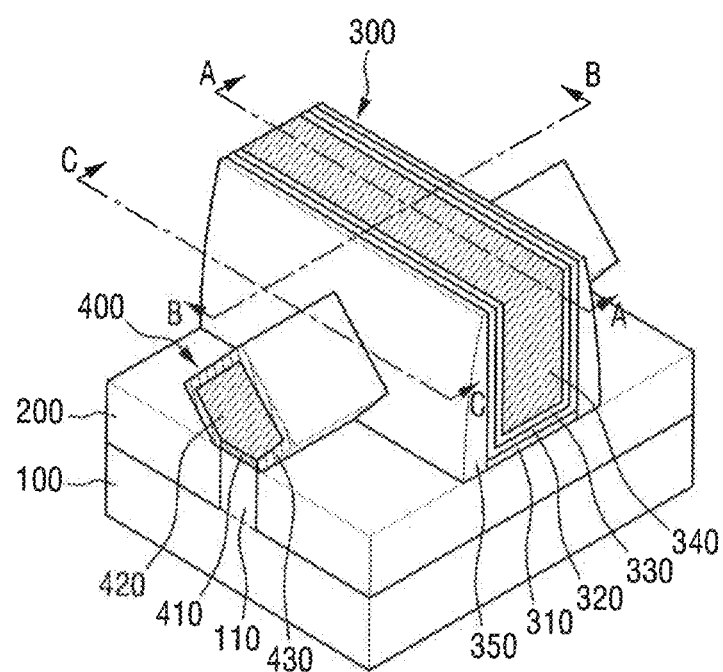
FIG. 1 is a perspective view illustrating a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 3:
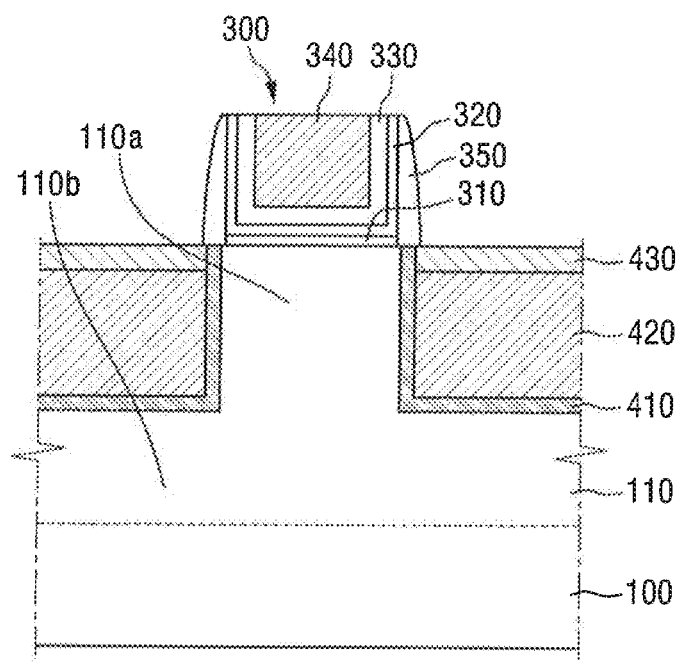
FIG. 3 is a diagram illustrating a cross-section taken along line B-B of FIG. 1.
Figure 4:
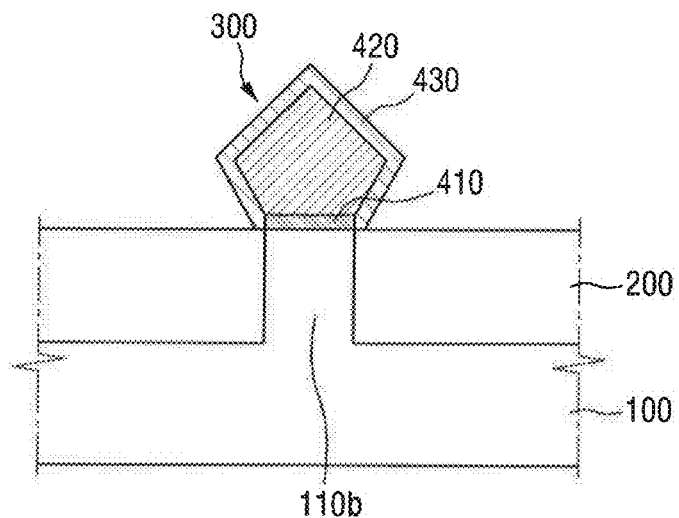
FIG. 4 is a diagram illustrating a cross-section taken along line C-C of FIG. 1.

Hereinafter, a semiconductor device according to an embodiment of the present inventive concept will be described with reference to FIGS. 1 to 4. FIG. 1 is a perspective view illustrating a semiconductor device according to an exemplary embodiment of the present inventive concept, FIG. 2 is a diagram illustrating a cross-section taken along line A-A of FIG. 1, FIG. 3 is a diagram illustrating a cross-section taken along line B-B of FIG. 1, and FIG. 4 is a diagram illustrating a cross-section taken along line C-C of FIG. 1.

Referring to FIG. 1, a semiconductor device according to an embodiment of the present inventive concept includes a substrate 100, a first active fin 110, a device isolation layer 200, a gate structure 300, and an epitaxial layer 400.

The substrate 100 may include Si, Ge, SiGe, GaP, GaAs, SiC, SiGeC, InAs, or InP. The substrate 100 may be a rigid substrate such as a silicon substrate, a silicon on insulator (SOI) substrate, a gallium arsenide substrate, a silicon germanium substrate, a ceramic substrate, a quartz substrate, or a displaying glass substrate. Alternatively, the substrate 100 may be a flexible plastic substrate such as polyimide, polyester, polycarbonate, polyethersulfone, polymethylmethacrylate, polyethylene naphthalate, or polyethyleneterephthalate.

Figure 2:
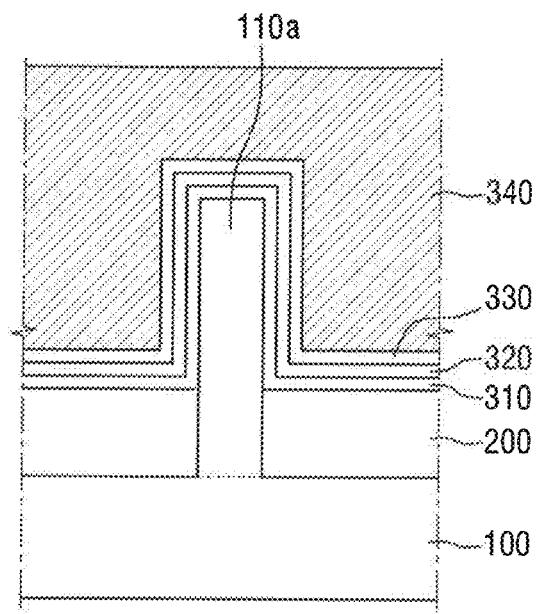
FIG. 2 is a diagram illustrating a cross-section taken along line A-A of FIG. 1.

Referring to FIGS. 1 and 2, the first active fin 110 protrudes from the substrate. The first active fin 110 is elongated along a second direction Y. The first active fin 110 may be a part of the substrate 100. The device isolation layer 200, which will be described below, covers a top surface of the substrate 100 and a lower part of the first active fin 110. The first active fin 110 includes a first region 110a and a second region 110b. The first region 110a of the first active fin 110 is covered with the gate structure 300, and the second region 110b of the first active fin 110 is not covered with the gate structure 300.

The device isolation layer 200 is formed on the substrate 100 to isolate a device. The device isolation layer 200 may be an insulating film including, but is not limited to, an HDP (High Density Plasma) oxidation film, an SOG (Silicon On Glass) oxidation film, or a CVD (Chemical Vapor Deposition) oxidation film.

The gate structure 300 is formed on the first region 110a of the first active fin 110 to intersect the first active fin 110. The gate structure 300 is elongated along a first direction X. The gate structure 300 includes an interface film 310, a gate insulating film 320, a work function adjusting film 330, a gate metal 340, and a gate spacer 350 which are sequentially formed on the first active fin 110. A channel may be formed at both side surfaces and a top surface of the first region 110a of the first active fin 110.

The interface film 310 is formed on the device isolation layer 200 and the first region 110a of the first active fin 110. The interface film 310 may serve to prevent a defective interface from being formed between the device isolation layer 200 and the gate insulating film 320. The interface film 310 includes a low dielectric material layer having a dielectric constant k of about 9 or lower, for example, a silicon dioxide film (k is about 4) or a silicon oxynitride film (k is about 4 to about 8 depending on a content of oxygen atom and nitrogen atom). Further, the interface film 310 may include silicate or a combination of the layers exemplified above.

The gate insulating film 320 is formed on the interface film 310. However, when the interface film 310 is not provided, the gate insulating film 320 may be formed on the device isolation layer 200 and the first active fin 110. The gate insulating film 320 includes a material having a high dielectric constant (high-K). For example, the gate insulating film 320 may include, but is not limited to, HfSiON, $HfO_2$, $ZrO_2$, $Ta_2O_5$, $TiO_2$, $SrTiO_3$, $BaTiO_3$, or $SrTiO_3$. The gate insulating film 320 may have various thickness depending on the material of the gate insulating film 320. For example, when the gate insulating film 320 is $HfO_2$, the gate insulating film 320 may have a thickness of about 5 Å to about 50 Å, but is not limited thereto. The gate insulating film 320 is upwardly extended along a side wall of the gate spacer 350, which will be described below. Alternatively, the gate insulating film 320 may be formed only on a bottom region defined by the gate spacer 350, without extending along the side wall of the gate spacer 350.

The work function adjusting film 330 is formed on the gate insulating film 320. The work function adjusting film 330 is in contact with the gate insulating film 320. The work function adjusting film 330 may serve to adjust a work function. The work function adjusting film 330 may include, for example, metal nitride. For example, the work function adjusting film 330 may include Mo, Pd, Ru, Pt, TiN, WN, TaN, Ir, TaC, RuN, TiAl, TaAlC, TiAlN, or MoN. The work function adjusting film 330 may be formed of, for example, a signal layer which is formed of TiN or a double layer which is formed of a TiN lower layer and a TaN upper layer, but is not limited thereto.

A capping layer may be formed between the gate insulating film 320 and the work function adjusting film 330. The capping layer may serve to adjust the work function. For example, the capping layer may serve as a buffer between the gate insulating film 320 and the work function adjusting film 330. Therefore, if the capping layer is provided, the work function may be more precisely adjusted as compared with a case where only the work function adjusting film 330 is provided. The capping layer may include, but is not limited to, LaO, GdO, DyO, SrO, BaO, an aluminum oxide film, or an aluminum metal oxide film. The work function adjusting film 330 is upwardly extended along a side wall of the gate spacer 350, which will be described below. Alternatively, the capping layer may be formed only on a bottom region defined by the gate spacer 350, without extending along the side wall of the gate spacer 350.

The gate metal 340 is formed on the work function adjusting film 330. The gate metal 340 is in contact with the work function adjusting film 330, filling a space defined by the spacer 350. The gate metal 340 may include a conductive material, for example, W or Al, but is not limited thereto.

The gate spacer 350 is formed on the substrate, defining the space where the interface film 310, the gate insulating film 320, the work function adjusting film 330 and the gate metal are formed. The gate spacer 350 may include, but is not limited to, a nitride film, an oxynitride film, or a low-k material. The outer side of the gate spacer 350 is curved, but the present inventive concept is not limited thereto and the gate spacer 350 may have different shapes. For example, the gate spacer 350 may have an I-shape or an L-shape, unlike the shape illustrated in the drawing. Further, the gate spacer 350 may be formed of a single layer, but the gate spacer 350 is not limited thereto and may be formed of multiple layers.

A source/drain 400 may be formed on at least one side of the gate structure 300. The source/drain 400 may also be referred to as an epitaxial layer 400. For example, the source/drain 400 is formed on the active fin 110. The source/drain 400 and the gate structure 300 may be insulated from each other by the gate spacer 350 of the gate structure 300. A silicide film may be formed on the source/drain. A contact may be formed on the silicide film. The silicide film is formed between the source/drain and the contact to reduce a sheet resistance and a contact resistance.

Next, the epitaxial layer 400 will be described with reference to FIGS. 1, 3, and 4.

Referring to FIG. 1, the epitaxial layer 400 is formed on the second region 110b of the active fin 110. The second region 110b of the active fin 110 is not covered with the gate structure 300. The epitaxial layer 400 includes a first epitaxial layer 410, a second epitaxial layer 420, and a cap layer 430.

The first epitaxial layer 410 is formed on the active fin 110 that is not covered by the gate structure 300.

The second epitaxial layer 420 is formed on the first epitaxial layer 410 and may include an impurity so that a turn-on resistance $R_{on}$ of the semiconductor device is reduced and a driving current is increased. The impurity of the second epitaxial layer 420 may include boron (B). When the second epitaxial layer 420 is doped with boron (b), the concentration of boron (B) may be, for example, about 3E20 $cm^{-3}$. The second epitaxial layer 420 may further include germanium (Ge).

The first epitaxial layer 410 may include a blocking material to prevent the impurity of the second epitaxial layer 420 from passing through the first epitaxial layer 410 to be diffused into a channel region formed at the first region 110a of the active fin 110. The channel region of the active fin 110 may be under the gate structure 300. The active fin 110 includes the first region 110a under the gate structure 300 and the second region 110b under the epitaxial layer 400. The channel region is formed at the first region 110a of the active fin 110, and the epitaxial layer 400 is formed on the second region 110b of the active fin 110. The blocking material of the first epitaxial layer 410 may include carbon (C). The concentration of carbon (C) may be, for example, in a range of about 1E18 cm$^{-3}$ to about 1E21 cm$^{-3}$. Alternatively, the concentration of carbon (C) may be about 2E20 cm$^{-3}$. The concentration of carbon (C) of the first epitaxial layer 410 may be in a range of about 0.001 atomic % to about 3 atomic %.

In an exemplary embodiment, the first and the second epitaxial layer 410 and 420 may both include a blocking material (for example, carbon (C)). In this case, the concentration of the blocking material included in the first epitaxial layer 410 may be higher than the concentration of the blocking material included in the second epitaxial layer 420. In an exemplary embodiment, the first and the second epitaxial layer 410 and 420 may both include an impurity (for example, boron (B)). In this case, the concentration of the impurity included in the second epitaxial layer 420 may be higher than the concentration of the impurity included in the first epitaxial layer 410.

Next, the cap layer 430 is formed on the second epitaxial layer 420. The cap layer 430 may include silicon (Si).

FIG. 3, cross-section taken along line B-B of FIG. 1, shows the substrate 100, the active fin 110 protruding from the substrate 100, and the epitaxial layer 400 formed on the second region of the active fin 110. The epitaxial layer 400 includes the first epitaxial layer 410, the second epitaxial layer 420, and the cap layer 430. The first epitaxial layer 410 may be conformally formed on an exposed surface of the second region in the active fin 110, having an L-shaped cross-section taken along the first direction X.

The second epitaxial layer 420, which includes an impurity to reduce the turn-on resistance $R_{on}$ of the semiconductor device to increase the driving current, is formed on the first epitaxial layer 410. The cap layer 430 is formed on the second epitaxial layer 420. Here, the first epitaxial layer 410 may include a blocking material which blocks the impurity included in the second epitaxial layer 420 from passing through the first epitaxial layer 410 to be diffused into the channel region under the gate structure 300. The thickness of the first epitaxial layer 410 may be smaller than the thickness of the second epitaxial layer 420.

FIG. 4, cross-section taken along line C-C of FIG. 1, shows the substrate 100, the second region 110b of the active fin 110 protruding on the substrate 100, and the epitaxial layer 400 formed on the second region of the active fin 110. The epitaxial layer 400 includes the first epitaxial layer 410, the second epitaxial layer 420, and the cap layer 430. The first epitaxial layer 410 may be conformally formed on an exposed surface of the recessed active fin 110. The second epitaxial layer 420, which includes an impurity in order to reduce the turn-on resistance $R_{on}$ of the semiconductor device to increase the driving current, is formed on the first epitaxial layer 410 and the cap layer 430 is formed on the second epitaxial layer 420. Here, the first epitaxial layer 410 may include a blocking material which blocks the impurity included in the second epitaxial layer 420 from passing through the first epitaxial layer 410 to be diffused into the channel region in the first region of the active fin 110. The thickness of the first epitaxial layer 410 may be smaller than the thickness of the second epitaxial layer 420.

The second epitaxial layer 420 has a diamond-shaped cross-section taken along the first direction of X along which the gate structure 300 is elongated. Alternatively, the second epitaxial layer 420 may have a polygon-shaped cross-section, such as a pentagonal or hexagonal shape, taken along the first direction of X along which the gate structure 300 is elongated. The angle formed by two surfaces of the second epitaxial layer 420 may be about 75.6° or about 109.4°.

The second epitaxial layer 420 includes a surface which is in contact with the first epitaxial layer 410 and a surface which is not in contact with the first epitaxial layer 410. Further, as illustrated in FIGS. 1 and 4, the cap layer 430 may be conformally formed on the surface of the second epitaxial layer 420 which is not in contact with the first epitaxial layer 410.

Figure 5:
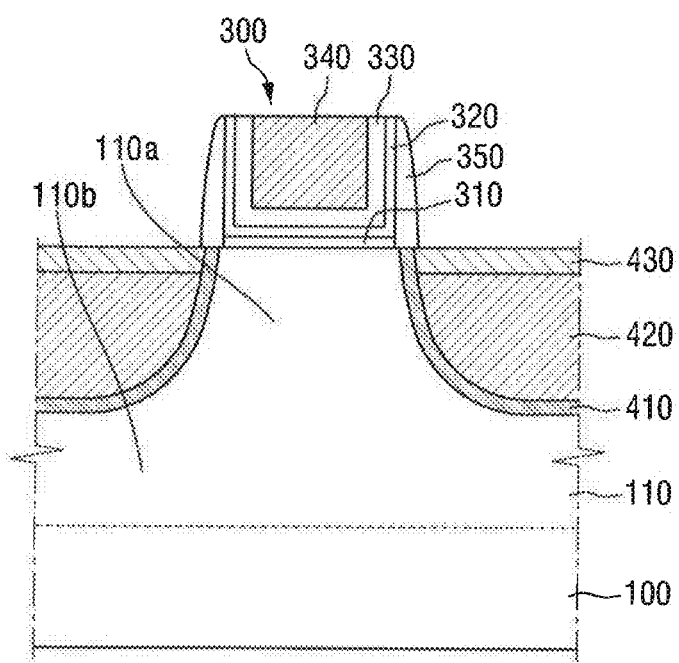
FIG. 5 is a cross-sectional view of a semiconductor device according to an exemplary embodiment of the present inventive concept.

Hereinafter, a semiconductor device according to an exemplary embodiment of the present inventive concept will be described with reference to FIG. 5. FIG. 5 is a cross-sectional view of a semiconductor device according to an exemplary embodiment of the present inventive concept.

FIG. 5 shows substantially similar cross-section to that of FIG. 3, except that a second region 110b of the active fin 110 has a curved surface in a cross-section taken along the first direction of X. For the convenience of description, descriptions of the same elements will be omitted here.

Figure 6:
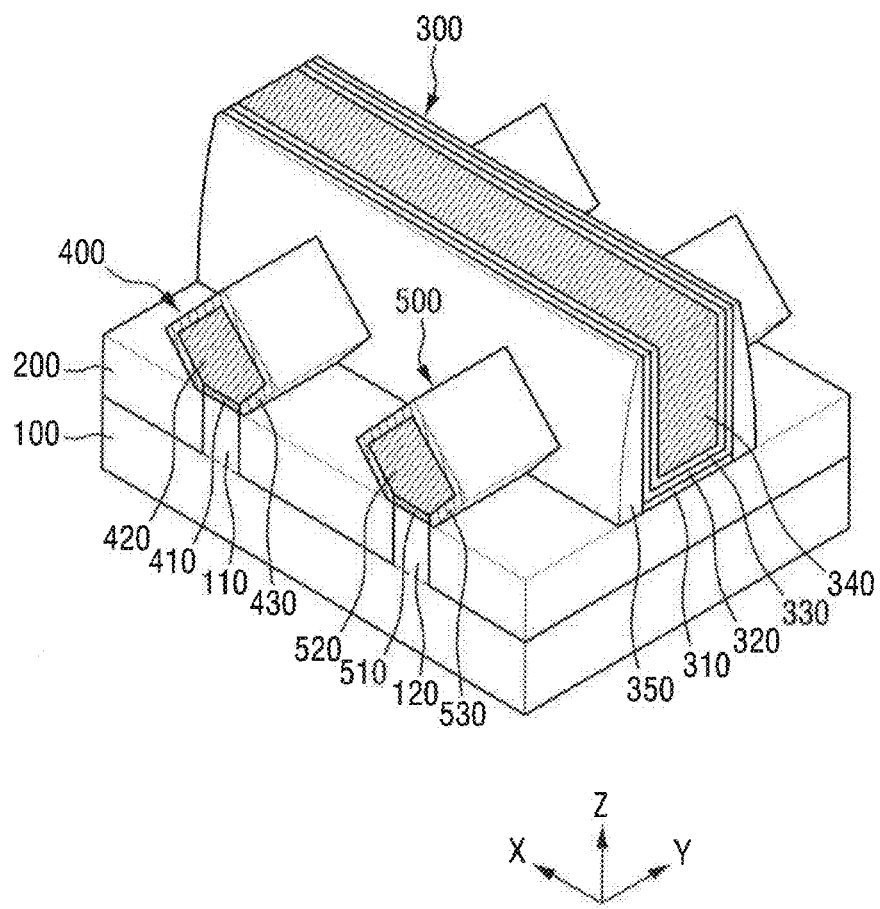
FIG. 6 is a perspective view illustrating a semiconductor device according to an exemplary embodiment of the present inventive concept.

FIG. 6 is a perspective view illustrating a semiconductor device according to an exemplary embodiment of the present inventive concept.

Referring to FIG. 6, the semiconductor device includes a gate structure 300, and a first and a second active fin 110 and 120. The gate structure 300 intersect the first and the second active fin 110 and 120. A first and a second buffer layer 410 and 510 are formed on the first and the second active fin 110 and 120, respectively. A first and a second impurity layer 420 and 520 are formed on the first and second buffer layers 410 and 510, respectively. The first and the second impurity layer 420 and 520 may include impurities. Here, the first and second buffer layers 410 and 510 may include a blocking material which blocks the impurities included in the first and second impurity layers 420 and 520 from passing through the first and second buffer layers 410 and 510 to be diffused into the channel region. Here, the first and second buffer layers 410 and 510 correspond to the first epitaxial layer described above and the first and second impurity layers 420 and 520 correspond to the second epitaxial layer described above. A first and a second cap layer 430 and 530 are formed on the first and the second impurity layer 420 and 520, respectively.

Hereinafter, a method of fabricating a semiconductor device according to an exemplary embodiment of the present inventive concept will be described. FIGS. 7 to 11 are diagrams illustrating a method of fabricating a semiconductor device according to an exemplary embodiment of the present inventive concept.

Figure 7:
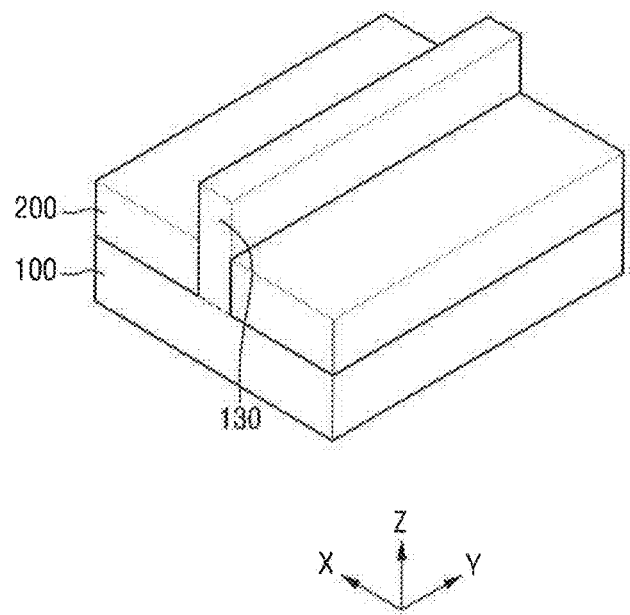
FIGS. 7 to 11 are diagrams illustrating a method of fabricating a semiconductor device according to an exemplary embodiment of the present inventive concept.

Referring to FIG. 7, first, a preliminary active fin 130 is formed on a substrate 100. The preliminary active fin 130 is formed to be elongated along a second direction Y. The preliminary active fin 130 and the substrate 100 may be integrally formed with each other or not. For example, the preliminary active fin 130 may be formed by partially removing the substrate, except for the region of the substrate corresponding to the preliminary active fin 130. Alternatively, the preliminary active fin 130 may be formed by forming an epitaxial layer on the substrate and then performing an etching process on the epitaxial layer. A doping process for adjusting a threshold voltage may be performed on the preliminary active fin 130. For an NMOS transistor, an impurity of boron (B) may be doped in the preliminary active fin 130. For a PMOS transistor, the impurity may be phosphorus (P) or arsenic (As). However, the present inventive concept is not limited thereto, but the doping process may be performed using different impurities. The preliminary active fin 130 may be formed using various processes, for example, an epitaxial process or an etching process.

A device isolation layer 200 is formed on the substrate 100. The device isolation layer 200 may serve to separate the preliminary active fins 130 from each other. The device isolation layer 200 may be formed of, but is not limited to, a silicon dioxide layer, a silicon nitride layer, or a silicon oxynitride layer. For example, a device isolation film is formed to cover the preliminary active fin 130 and then is etched using a mask film pattern as a mask to form the device isolation layer 200 and to expose an upper part of the active fin 120 protruding from the device isolation layer 200. In this case, a height of the exposed upper part of the preliminary active fin 130 may be adjusted by changing an etching time for the device isolation film. The device isolation layer 200 covers a lower part of the preliminary active fin 130. A top surface of the device isolation layer 200 is lower than a top surface of the preliminary active fin 130.

Figure 8:
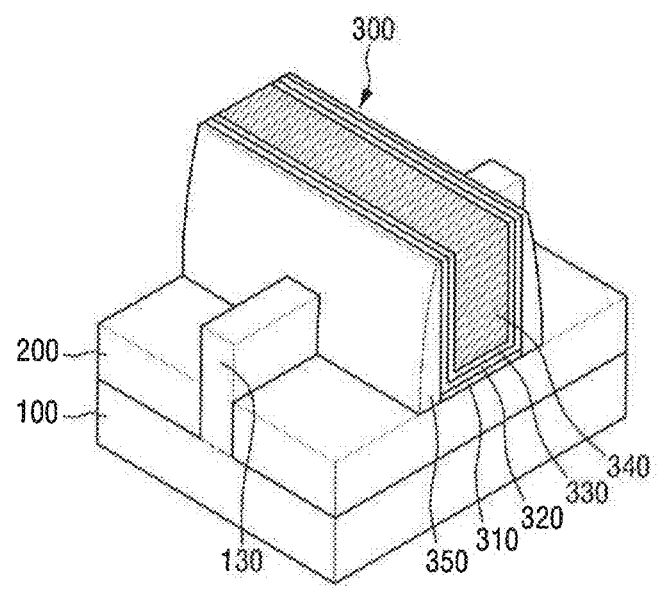

Referring to FIG. 8, a gate structure 300 is formed on the substrate 100, on which the preliminary active fin 130 is formed, in a direction intersecting the preliminary active fin 130. The gate structure 300 may be formed by sequentially laminating an interface film 310, a gate insulating film 320, a work function adjusting film 330, and a gate metal 340.

Figure 9:
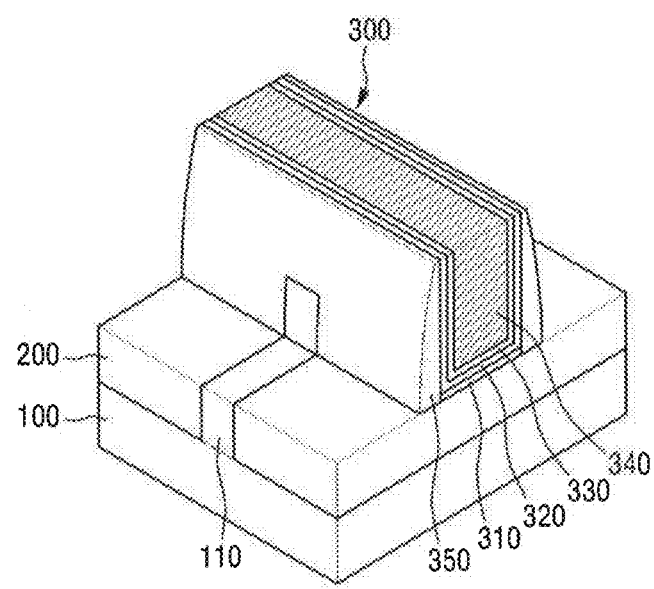

Referring to FIG. 9, a part of the preliminary active fin 130 which is not covered with the gate structure 300 is removed to form an active fin 110. The top surface of the active fin 130 that is not covered with the gate structure 300 has substantially the same height as the top surface of the device isolation layer 200.

Figure 10:
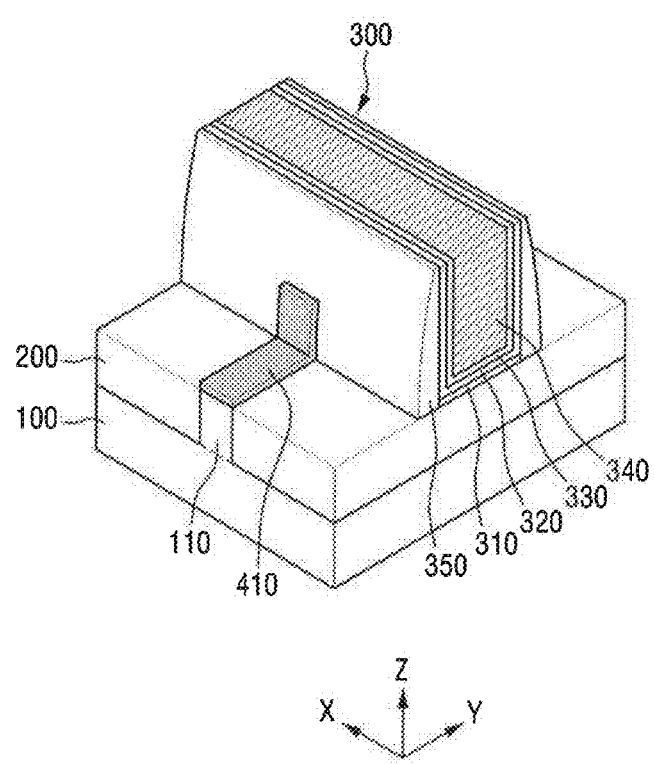

Referring to FIG. 10, a first epitaxial layer 410 is conformally formed on the exposed surface of the active fin 110. Also referring to FIG. 3, in an exemplary embodiment of the present inventive concept, the first epitaxial layer 410 has an L-shaped cross-section taken along a second direction Y. Alternatively, in an exemplary embodiment of the present inventive concept, the first epitaxial layer 410 has a curved cross-section in the second direction Y, as illustrated in FIG. 5.

A blocking material may be doped in the first epitaxial layer 410 before forming a second epitaxial layer 420 which will be described in FIG. 11. The blocking material of the first epitaxial layer 410 may serve to block impurities of the second epitaxial layer 420 from passing through the first epitaxial layer 410 to a channel region of the active fin 110.

Figure 11:
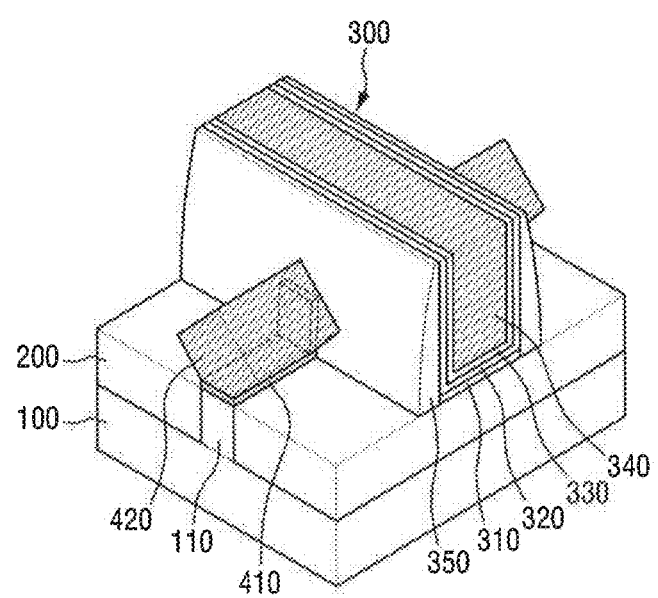

Referring to FIG. 11, the epitaxial layer 420 is formed on the first epitaxial layer 410. The epitaxial layer 420 may include impurities to reduce a turn-on resistance $R_{on}$ of the semiconductor device and to increase a driving current. A thickness of the first epitaxial layer 410 may be smaller than a thickness of the second epitaxial layer 420. As described above, the first epitaxial layer 410 may include a blocking material which blocks the impurity included in the second epitaxial layer 420 from passing through the first epitaxial layer 410 to be diffused into a channel region.

The second epitaxial layer 420 is formed to have a diamond-shaped cross-section taken along the first direction of X along which the gate structure 300 is elongated. The cross-section shape is not limited thereto, and may have various shapes. For example, the second epitaxial layer 420 may have a polygon-shaped cross-section, such as a pentagonal or hexagonal shape. Further, in an exemplary embodiment, an angle formed by two surfaces of the second epitaxial layer 420 may be about 75.6° or about 109.4°.

The second epitaxial layer 420 may apply stress to the active fin 110 thereby increasing a carrier mobility in a channel region of a finFET. When a finFET is a p type transistor, the second epitaxial layer 420 may include a compressed stress material. The compressed stress material may be a material having a greater lattice constant than that of Si. For example, the compressed stress material may include SiGe. Further, when a finFET is an N type transistor, the epitaxial layer may include the same material as the substrate 100 or a tensile stress material. For example, when the substrate is Si, the tensile stress material may be Si or a material, such as SiC, having a lower lattice constant than that of Si.

The second epitaxial layer 420 may include an impurity such as boron (B) to reduce the turn-on resistance of $R_{on}$ in the finFET at a high concentration. The impurity of the second epitaxial layer 420 may be prevented from being diffused into the channel of the active fin 110 using the first epitaxial layer 410 interposed between the second epitaxial layer 420 and the active fin 110.

When a buffer layer is used instead of the first epitaxial layer 410, the buffer layer may have a thickness greater than a thickness of the first epitaxial layer 410. If the overall thickness of the gate structure 300 remain substantially the same, such higher thickness of the buffer layer reduces a thickness of the second epitaxial layer 420 and in turn, reduces the stress effect of the second epitaxial layer 420 on the channel of the finFET. According to an exemplary embodiment of the present inventive concept, the impurity of the second epitaxial layer 420 may be prevented from being diffused in to the channel of the finFET using the first epitaxial layer 410 having a blocking material without reducing the stress effect of the second epitaxial layer 420 on the active fin 110.

Figure 12:
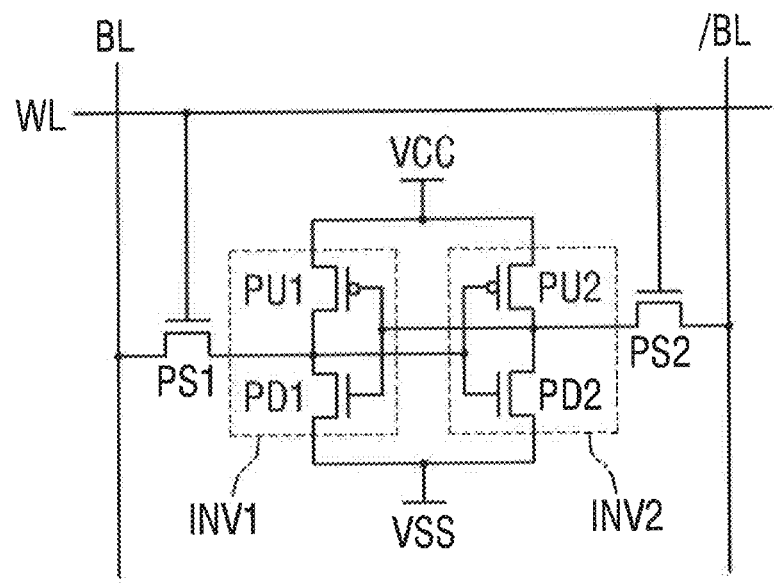
FIGS. 12 to 14 are circuit diagrams and layout diagrams illustrating a semiconductor device according to an exemplary embodiment of the present inventive concept.
Figure 13:
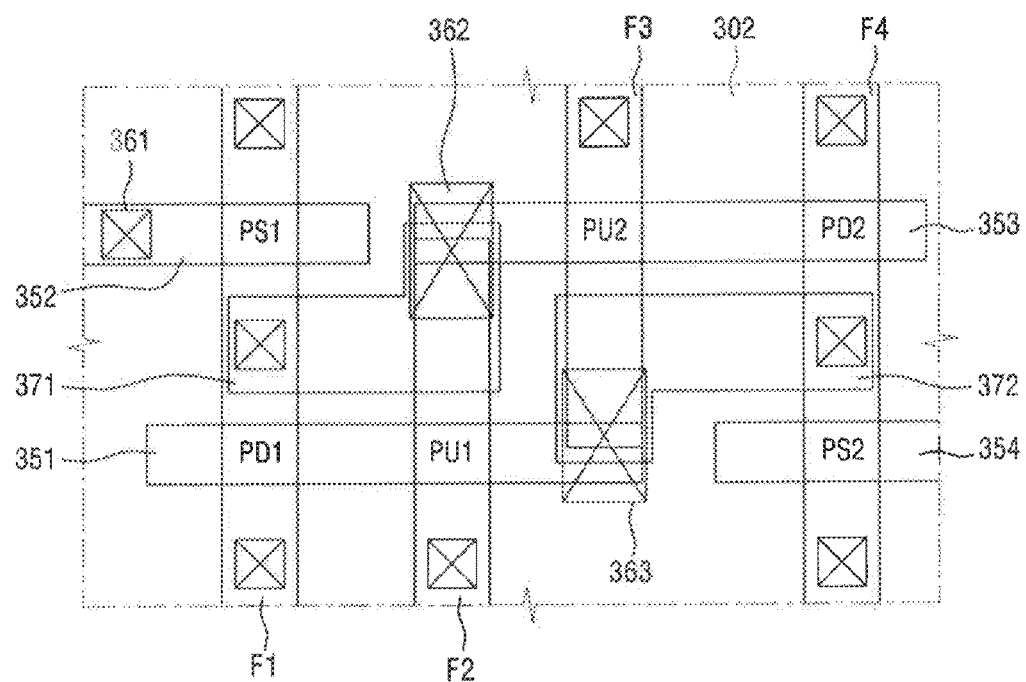
Figure 14:
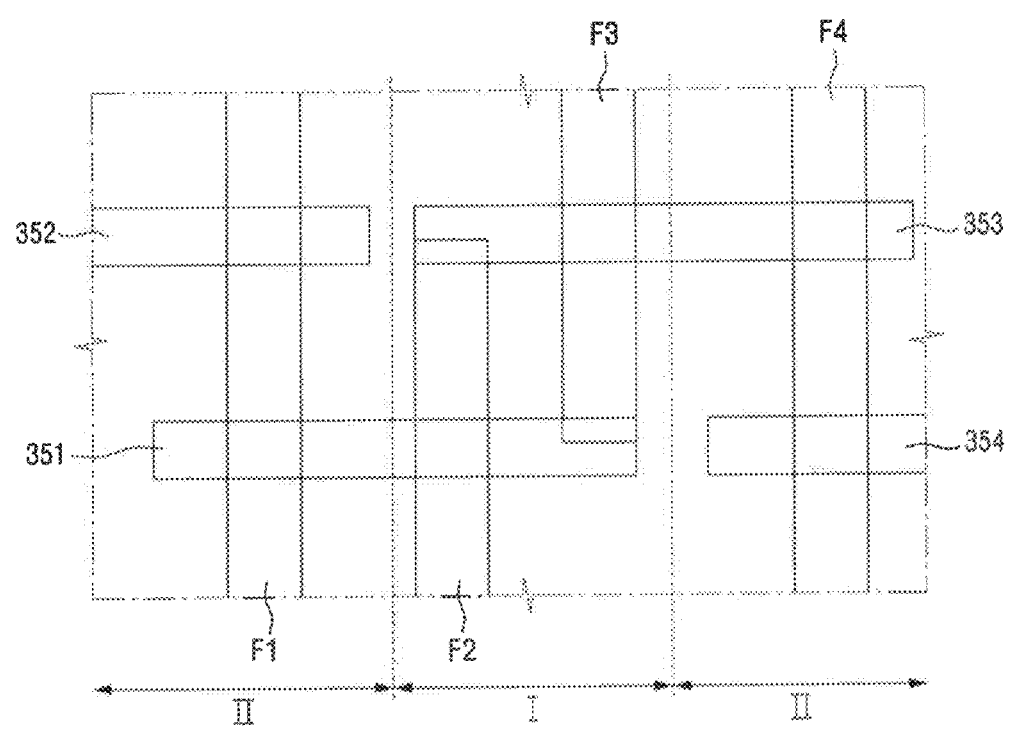

FIGS. 12 and 13 are a circuit diagram and a layout diagram illustrating a semiconductor device according to an exemplary embodiment of the present inventive concept. FIG. 14 is a layout diagram illustrating only a plurality of fins and a plurality of gate structures of the layout diagram of FIG. 13. The semiconductor device according to an exemplary embodiment of the present inventive concept may be applied to semiconductor devices including a fin type transistor, but FIGS. 12 and 14 illustrate an exemplary SRAM device using a fin type transistor according to an exemplary embodiment of the present inventive concept.

First, referring to FIG. 12, the SRAM device includes a pair of inverters INV1 and INV2 which are connected in parallel between a power node Vcc and a ground node Vss and a first pass transistor PS1 and a second pass transistor PS2 which are connected to output nodes of the inverters INV1 and INV2, respectively. The first pass transistor PS1 and the second pass transistor PS2 is connected with a bit line BL and a complementary bit line /BL, respectively. Gates of the first pass transistor PS1 and the second pass transistor PS2 are connected to a word line WL.

The first inverter INV1 includes a first pull-up transistor PU1 and a first pull-down transistor PD1 which are connected in series and the second inverter INV2 includes a second pull-up transistor PU2 and a second pull-down transistor PD2 which are connected in series. The first pull-up transistor PU1 and the second pull-up transistor PU2 are PMOS transistors and the first pull-down transistor PD1 and the second pull-down transistor PD2 are NMOS transistors.

The first inverter INV1 and the second inverter INV2 are cross-coupled to each other such that an input node of the first inverter INV1 is connected to an output node of the second inverter INV2 and an input node of the second inverter INV2 is connected to an output node of the first inverter INV1 to constitute one latch circuit.

Here, referring to FIGS. 12 to 14, a first fin F1, a second fin F2, a third fin F3, and a fourth fin F4, which are spaced apart from each other, are formed to be elongated in one direction (for example, a vertical direction of FIG. 13). Elongated lengths of the second fin F2 and the third fin F3 may be shorter than those of the first fin F1 and the fourth fin F4.

Further, a first gate structure 351, a second gate structure 352, a third gate structure 353, and a fourth gate structure 354 are elongated in another direction (for example, a horizontal direction of FIG. 13) and formed in a direction intersecting the first fin F1 to the fourth fin F4. For example, the first gate structure 351 is formed to intersect the first fin F1 and the second fin F2 and is overlaid with a part of an end of the third fin F3. The third gate structure 353 is formed to intersect the fourth fin F4 and the third fin F3 and is overlaid with a part of an end of the second fin F2. The second gate structure 352 and the fourth gate structure 354 are formed to intersect the first fin F1 and the fourth fin F4, respectively.

As illustrated in FIG. 13, the first pull-up transistor PU1 is defined around a region where the first gate structure 351 intersects the second fin F2, the first pull-down transistor PD1 is defined around a region where the first gate structure 351 intersects the first fin F1, and the first pass transistor PS1 is defined around a region where the second gate structure 352 intersects the first fin F1. The second pull-up transistor PU2 is defined around a region where the third gate structure 353 intersects the third fin F3, the second pull-down transistor PD2 is defined around a region where the third gate structure 353 intersects the fourth fin F4, and the second pass transistor PS2 is defined around a region where the fourth gate structure 354 intersects the fourth fin F4.

Even though not specifically illustrated, the first to fourth gate structures 351 to 354 may cover the first to fourth fins F1 to F4, exposing both sides of the first to fourth fins F1 to F4, respectively. A source/drain may be formed on the exposed sides of the first to fourth fins F1 to F4. A plurality of contacts 361 may be formed.

Further, the second fin F2, the third gate structure 353, and a wiring line 371 are connected to each other using a shared contact 362. The third fin F3, the first gate structure 351, and a wiring line 372 are connected to each other using a shared contact 363.

The transistors including the first pull-up transistor PU1, the first pull-down transistor PD1, the first pass transistor PS1, the second pull-up transistor PU2, the second pull-down transistor PD2, and the second pass transistor PS2 may be exemplary finFET transistors of the present inventive concept.

Figure 15:
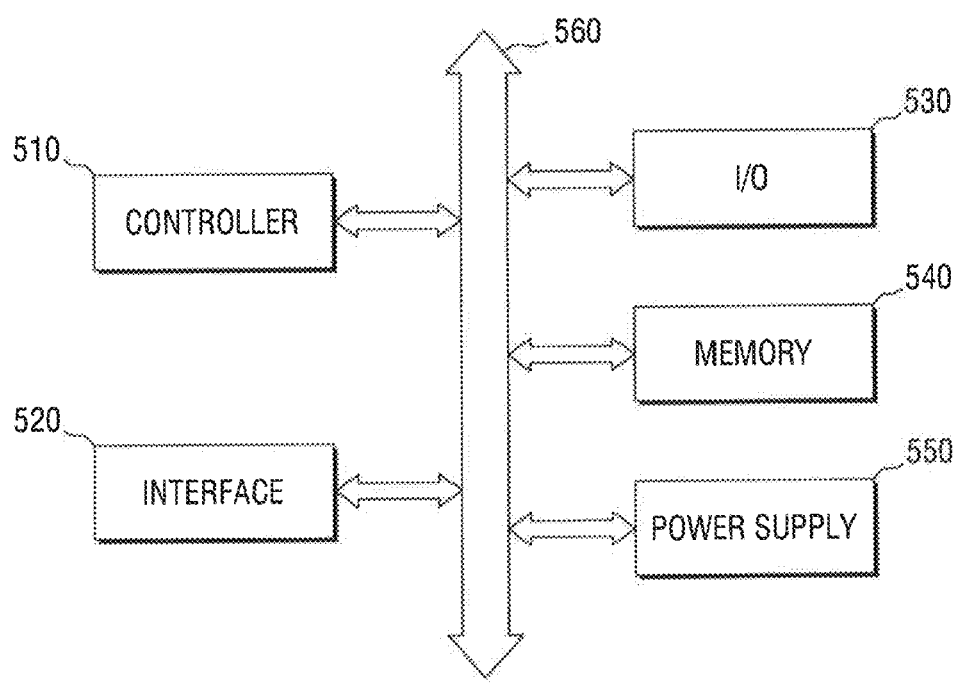
FIG. 15 is a schematic block diagram illustrating an electronic system which includes a semiconductor device according to an exemplary embodiment of the present inventive concept.

Hereinafter, an electronic system which includes a semiconductor device according to an exemplary embodiments of the present inventive concept will be described. FIG. 15 is a schematic block diagram illustrating an electronic system which includes a semiconductor device according to an exemplary embodiment of the present inventive concept.

Referring to FIG. 15, the electronic system includes a controller 510, an interface 520, an input/output device 530, a memory 540, a power supply 550, and a bus 560.

The controller 510, the interface 520, the input/output device 530, the memory 540, and the power supply 550 may be coupled to each other through the bus 560. The bus 560 corresponds to a path through which data moves.

The controller 510 includes at least one of a microprocessor, a micro controller, and logical elements, which may perform a similar function to the above-mentioned device, to process data.

The interface 520 may function to transmit data to a communication network or receive data from the communication network. The interface 520 may be a wired or wireless type. For example, the interface 520 includes an antenna or a wired or wireless transceiver.

The input/output device 530 includes a keypad and a display device to input and output data.

The memory device 540 may store data and/or a command language. The semiconductor device according to some embodiments of the present inventive concept may be provided as a part of constituent elements of the memory 540.

The power supply 550 may convert power input from the outside and provide the converted power to the respective constituent elements 510 to 540.

Figure 16:
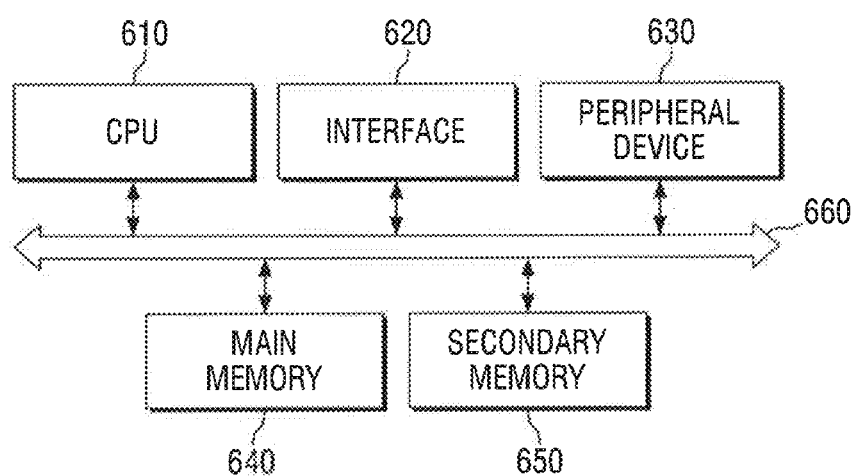
FIG. 16 is a schematic block diagram illustrating an electronic system which includes a semiconductor device according to an exemplary embodiment of the present inventive concept.

FIG. 16 is a schematic block diagram illustrating an electronic system which includes a semiconductor device according to an exemplary embodiment of the present inventive concept.

Referring to FIG. 16, the electronic system includes a CPU (Central Processing Unit) 610, an interface 620, a peripheral device 630, a main memory 640, a secondary memory 650, and a bus 660.

The CPU 610, the interface 620, the peripheral device 630, the main memory 640, and the secondary memory 650 are coupled to each other through the bus 660. The bus 660 corresponds to a path through which data moves.

The CPU 610 includes a controller and an operating device to execute a program and process data.

The interface 620 may function to transmit data to a communication network or receive data from the communication network. The interface 620 may be a wired or wireless type. For example, the interface 620 includes an antenna or a wired or wireless transceiver.

The peripheral device 630 includes a mouse, a keyboard, a display device, and a print device to input and output data.

The main memory 640 may transmit and receive data to and from the CPU 610 and store data and/or command languages required to execute the program. The semiconductor device according to some embodiments of the present inventive concept may be provided as a part of constituent elements of the main memory 640.

The secondary memory 650 includes a nonvolatile memory, such as a magnetic tape, a magnetic disk, a floppy disk, a hard disk, or an optical disk, to store data and/or a command language. The secondary memory 650 may store data even when a power of the electronic system is not supplied.

Further, the semiconductor device according to an exemplary embodiment of the present inventive concept may be provided as one of various constituent elements of an electronic device, such as a computer, an ultra mobile PC (UMPC), a workstation, a net-book computer, personal digital assistants (PDA), a portable computer, a web tablet, a wireless phone, a mobile phone, a smart phone, an e-book, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, or one of various constituent elements configuring a computing system.

For simplicity of description, a semiconductor device according to an exemplary embodiment includes a single active fin. However, the present inventive concept is not limited thereto, and multiple active fin may be provided to constitute a multi gate field effect transistor MuGFET.

Further, a semiconductor device according to an exemplary embodiment of the present inventive concept may be used for a logic region and an SRAM region. For example, a logic nFET, a logic pFET, an SRAM nFET, or an SRAM pFET in the logic region or the SRAM region may be selectively formed using a semiconductor device according to an exemplary embodiment. However, the application of the present inventive concept is not limited to the logic region and the SRAM region, but the present inventive concept may be applied to a region (for example, a DRAM, an MRAM, an RRAM, or a PRAM) in which a different memory from the logic region is formed.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
   an active fin protruding from a substrate;
   a gate structure formed on the substrate and the active fin, the gate structure extending in a first direction, the gate structure crossing a first region of the active fin in a second direction;
   a first epitaxial layer formed on a second region of the active fin, the second region of the active fin not being covered with the gate structure; and
   a second epitaxial layer formed on the first epitaxial layer, the second epitaxial layer including an impurity,
   wherein the first epitaxial layer includes a blocking material, the blocking material of the first epitaxial layer configured to reduce an amount of the impurity of the second epitaxial layer from passing through the first epitaxial layer, thereby blocking diffusion of the impurity to a channel region formed in the first region of the active fin.

2. The semiconductor device of claim 1, wherein the second epitaxial layer further includes the blocking material, and
   a concentration of the blocking material included in the first epitaxial layer is higher than a concentration of the blocking material included in the second epitaxial layer.

3. The semiconductor device of claim 1, wherein the first epitaxial layer further includes the impurity, and
   a concentration of the impurity included in the second epitaxial layer is higher than a concentration of the impurity included in the first epitaxial layer.

4. The semiconductor device of claim 1, wherein the first epitaxial layer is conformally formed on the second region of the active fin.

5. The semiconductor device of claim 4, wherein the first epitaxial layer has an L-shaped cross-section taken along the second direction.

6. The semiconductor device of claim 4, wherein the first epitaxial layer has a curved-shaped cross-section taken along the second direction.

7. The semiconductor device of claim 1, wherein the second epitaxial layer has a diamond-shaped cross-section taken along the first direction.

8. The semiconductor device of claim 1, wherein the second epitaxial layer has a pentagonal-shaped cross-section taken along the first direction.

9. The semiconductor device of claim 1, further comprising:
   a cap layer covering the second epitaxial layer.

10. The semiconductor device of claim 1, wherein a thickness of the first epitaxial layer is smaller than a thickness of the second epitaxial layer.

11. The semiconductor device of claim 1, wherein the gate structure comprises:
    a gate insulating layer formed on the substrate; and
    a spacer formed on the substrate, the spacer defining the gate insulating layer,
    wherein the gate insulating layer upwardly extends along a side wall of the spacer.

12. The semiconductor device of claim 1, wherein the impurity includes boron (B) and the blocking material includes carbon (C), wherein a concentration of carbon (C) ranges from about 1E18 $cm^{-3}$ to about 1E21 $cm^{-3}$.

13. The semiconductor device of claim 1, further comprising a device isolation layer, wherein the active fin includes a first and a second active fin, the device isolation layer electrically isolating the first active fin and the second active fin.

14. A semiconductor device, comprising:
    an active fin protruding from a substrate;
    a gate structure formed on the substrate, the gate structure extending in a first direction, the gate structure crossing a first region of the active fin in a second direction;
    a first epitaxial layer formed on a second region of the active fin, the second region of the active fin not being covered with the gate structure; and
    a second epitaxial layer formed on the first epitaxial layer, the second epitaxial layer including an impurity,
    wherein the first epitaxial layer includes a blocking material, the blocking material preventing the impurity from passing through the first epitaxial layer, thereby blocking diffusion of the impurity to a channel region formed in the first region of the active fin, and
    wherein the second epitaxial layer includes a stress material which causes the second epitaxial layer to apply stress to the channel region.

15. The semiconductor device of claim 14, wherein the first epitaxial layer further includes the stress material, and
    a concentration of the stress material included in the second epitaxial layer is higher than a concentration of the stress material included in the first epitaxial layer.

* * * * *